(12) United States Patent
Hosoda et al.

(10) Patent No.: US 6,355,582 B1
(45) Date of Patent: Mar. 12, 2002

(54) SILICON NITRIDE FILM FORMATION METHOD

(75) Inventors: Keizo Hosoda, Ibaraki; Nobuaki Shigematsu; Yusuke Muraki, both of Yamanashi; Atsushi Sato, Tokyo, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/662,328

(22) Filed: Sep. 14, 2000

(30) Foreign Application Priority Data

Sep. 17, 1999 (JP) ............................................. 11-263718

(51) Int. Cl.[7] ........................ H01L 21/31; H01L 21/318
(52) U.S. Cl. ...................................................... 438/791
(58) Field of Search ................................... 438/791, 778

(56) References Cited

U.S. PATENT DOCUMENTS 5,877,073 A * 3/1999 Mao et al. ................... 438/585
6,146,938 A * 11/2000 Saida et al. .................. 438/239

FOREIGN PATENT DOCUMENTS

| DE | 2723501 A | * | 11/1978 |
| JP | 60089575 A | * | 5/1985 |
| JP | 11074485 A | * | 3/1999 |
| JP | 2000100809 A | * | 4/2000 |
| JP | 2000100812 A | * | 4/2000 |

* cited by examiner

Primary Examiner—Richard Elms
Assistant Examiner—Beth E. Owens
(74) Attorney, Agent, or Firm—Finnegan, Henderson, Farabow, Garrett & Dunner, L.L.P.

(57) ABSTRACT

In a silicon nitride film formation method, a substrate to be subjected to film formation is heated, and silicon tetrachloride and ammonia gases are supplied to the substrate heated to a predetermined temperature. The ratio of the partial pressure of the silicon tetrachloride gas to that of the ammonia gas is set to not less than 0.5.

5 Claims, 4 Drawing Sheets

SILICON NITRIDE FILM FORMATION METHOD

BACKGROUND OF THE INVENTION

The present invention relates to a method of forming a silicon nitride film used for, e.g., the capacitor of a semiconductor integrated circuit.

As a dielectric film forming the capacitor of a DRAM (Dynamic Random Access Memory) constituted by one transistor and one capacitor, a silicon nitride film is used in terms of high availability and easy handling of a film formation material.

Formation of the silicon nitride film adopts CVD (Chemical Vapor Deposition) using, as source gases, dichlorosilane ($SiCl_2H_2$) as silicon chloride gas, and ammonia gas. If the dichlorosilane supply amount increases in forming a silicon nitride film by CVD, particles as a by-product mainly containing ammonium chloride are undesirably produced in the film formation atmosphere. To prevent this, the dichlorosilane supply amount is set about 1/5 the ammonia supply amount.

In general, a dielectric film forming a capacitor must have a critical voltage at 10 $nA/cm^2$ of 1 V or more due to the following reason. That is, the operation voltage of a semiconductor integrated circuit using a DRAM is about 1.8 V at present. The critical voltage of the capacitor must be about half this voltage, and must be substantially 1 V or more with a margin. If the operation voltage of the DRAM decreases in the near future, the critical voltage of the capacitor may suffice to be 0.7 V or more.

The dielectric film of the capacitor requires a dielectric characteristic of 4 nm or less in film thickness in conversion into silicon oxide. Hence, the film thickness of silicon nitride is decreased to about 5 nm.

In summary, the silicon nitride film used as a dielectric film forming the capacitor of a DRAM must attain a critical voltage of 0.7 V to 1 V or more with a small film thickness of 5 nm.

However, according to the conventional silicon nitride film formation method, hydrogen readily enters a formed silicon nitride film. When a thin film is formed as described above, a leakage current is readily generated, failing to obtain a critical voltage of 0.7 V or more.

SUMMARY OF THE INVENTION

The present invention has been made to overcome the conventional drawbacks, and has as its object to form a silicon nitride film with a film thickness of about 5 nm and a critical voltage of 0.7 V or more while suppressing generation of any leakage current.

To achieve the above object, according to the present invention, there is provided a silicon nitride film formation method comprising the steps of heating a substrate to be subjected to film formation, and supplying silicon tetrachloride gas and ammonia gas to the substrate heated to a predetermined temperature, wherein the ratio of a partial pressure of the silicon tetrachloride gas to a partial pressure of the ammonia gas is set to not less than 0.5.

DESCRIPTION OF THE PREFERRED EMBODIMENT

A preferred embodiment of the present invention will be described below with reference to the accompanying drawings.

Figure 1:
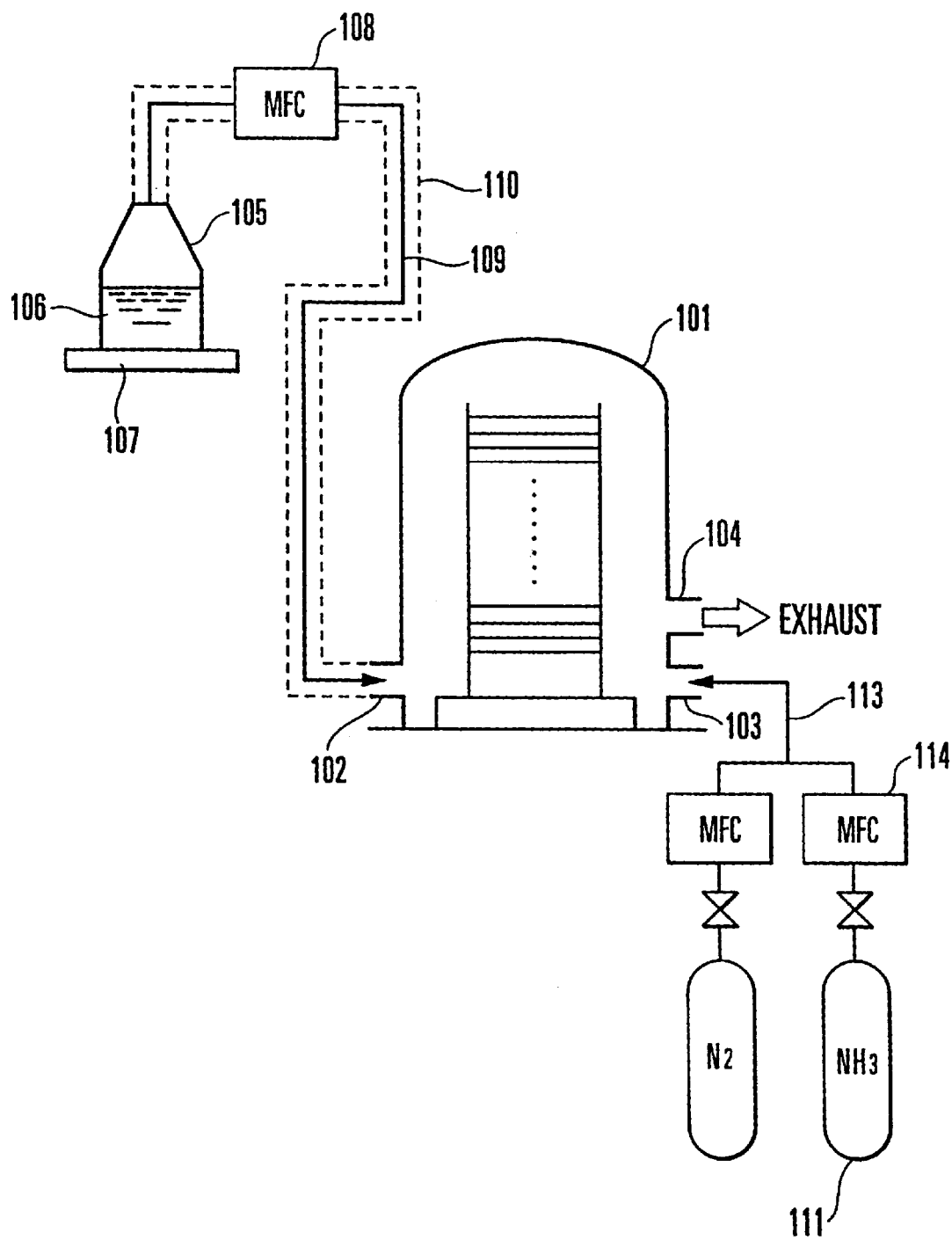
FIG. 1 is a view showing the schematic arrangement of a film formation apparatus used in an embodiment of the present invention.

This embodiment employs the following film formation apparatus illustrated in FIG. 1.

This film formation apparatus comprises a heating vessel 101 having a mechanism of heating the interior. Silicon tetrachloride gas is introduced from a source gas inlet portion 102 into the heating vessel 101, and ammonia gas is supplied from an additive gas inlet portion 103 into the heating vessel 101. The internal gas of the heating vessel 101 is exhausted via an exhaust portion 104.

A source tank 105 stores liquid silicon tetrachloride (TCS) 106 serving as a source, and is heated by a heater 107 to produce TCS gas. The flow rate of the TCS gas stored in the source tank 105 is controlled by a flow controller 108, and the TCS gas is introduced from the source gas inlet portion 102 into the heating vessel 101 via a source gas supply path 109.

The source gas supply path 109 is heated to a predetermined temperature by a supply path heating means 110 so as not to liquefy the TCS gas passing through the source gas supply path 109.

The additive gas inlet portion 103 of the heating vessel 101 is connected to an ammonia gas cylinder 111 via an additive gas supply path 113. The flow rate of ammonia gas from the ammonia gas cylinder 111 is controlled by a flow controller 114, and the ammonia gas is guided to the additive gas supply path 113. The ammonia gas guided to the additive gas supply path 113 is introduced from the additive gas inlet portion 103 into the heating vessel 101.

The heating vessel 101 receives the TSC gas from the source tank 105 and the ammonia gas from the ammonia gas cylinder 111. While the TCS and ammonia gases are supplied to the heating vessel 101, a substrate to be subjected to film formation in the heating vessel 101 can be heated to form a silicon nitride film on the substrate.

As described above, the present invention uses TCS as a source gas, and forms a silicon nitride film by thermal CVD using ammonia gas added as an additive gas to TCS. In addition, the present invention sets the ratio of the partial pressure of TCS gas to ammonia gas serving as an additive gas in the heating vessel 101 to 0.5 or more.

More specifically, a substrate to be subjected to film formation is placed in the heating vessel 101, and heated to a predetermined temperature.

The TCS 106 in the source tank 105 is heated by the heater 107 to produce TCS gas. The produced TCS gas is supplied to the heating vessel 101 while its supply amount is controlled by the flow controller 108. At the same time as supply of the TCS gas, ammonia gas is discharged from the ammonia gas cylinder 111, and supplied to the heating vessel 101 while its supply amount is controlled by the flow controller 114. The ratio of the partial pressure of the TCS gas in the heating vessel 101 to that of the ammonia ($NH_3$) gas is set to 0.5 or more under the control of the flow controllers 108 and 114.

When the ratio of the partial pressure of the TCS gas in the heating vessel 101 to that of the ammonia (NH$_3$) gas is set to 0.5 or more, the temperature in the heating vessel 101 is set to, e.g., 600 to 700° C., and the temperature of the substrate in the vessel 101 is also set to 600 to 700° C. The total pressure in the heating vessel 101 is set to 0.2 Torr.

While the substrate temperature is 600 to 700° C., the total pressure in the heating vessel 101 is 0.2 Torr, and the ratio of the partial pressure of the TCS gas in the heating vessel 101 to that of the ammonia (NH$_3$) gas is 0.5 or more, the respective gases supplied to the heating vessel 101 are decomposed on the heated substrate placed in the heating vessel 101, and a silicon nitride film is formed on the substrate. A gas which does not contribute to formation of the silicon nitride film among the gases supplied to the heating vessel 101 is exhausted from the exhaust portion 104.

The silicon nitride film formed by thermal CVD using the TCS and ammonia gases as source gases can attain a critical voltage of 0.7 V or more with a film thickness of 5 nm.

Figure 2:
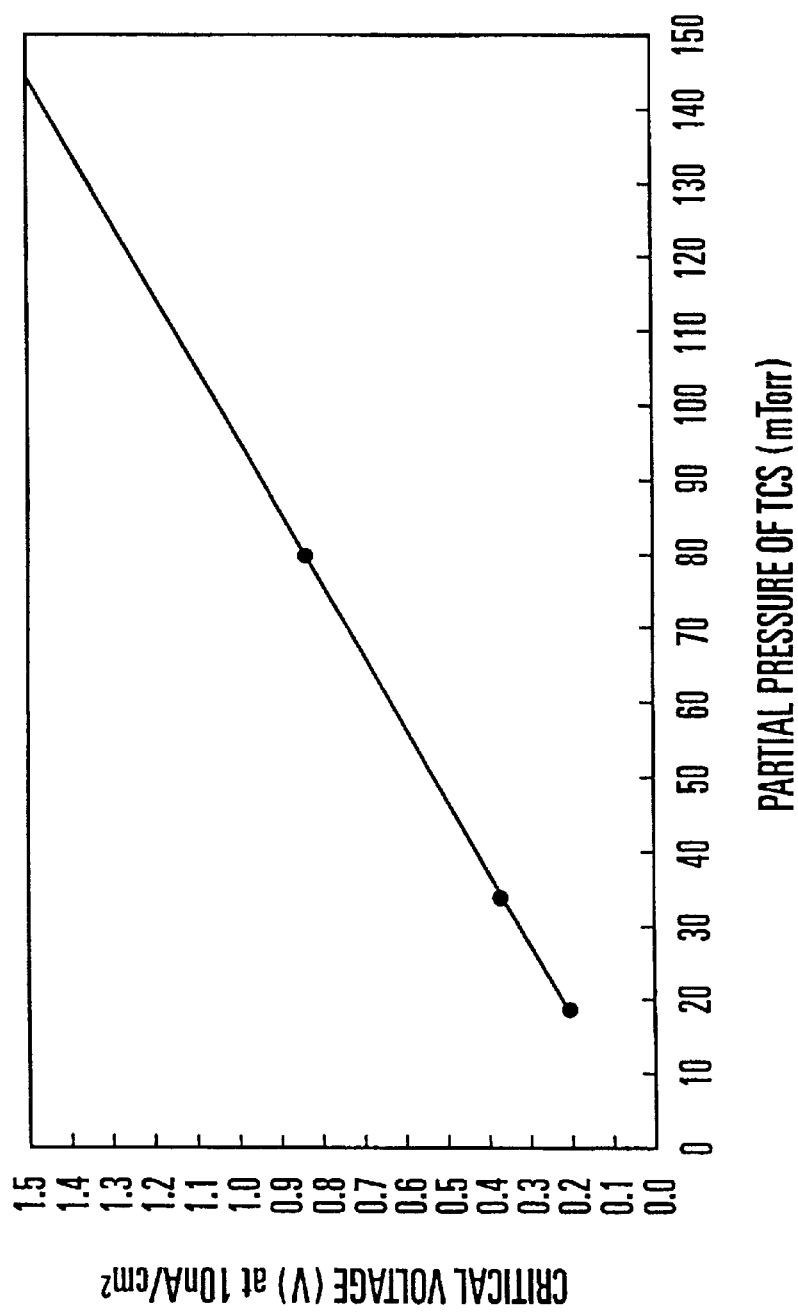
FIG. 2 is a graph showing the critical voltage of a formed silicon nitride film as a function of the partial pressure of TCS gas.

FIG. 2 shows the partial pressure of TCS gas in the heating vessel 101, and the voltage value at which the leakage current per unit area of a silicon nitride film 5 nm thick formed at a corresponding partial pressure reaches a given value. In this case, the total pressure of the supply gas to the heating vessel 101 is set constant at 200 mTorr.

As is apparent from FIG. 2, a silicon nitride film formed by thermal CVD exhibits a higher critical voltage for a higher partial pressure of TCS gas. For example, when the partial pressure of TCS gas is about 66 mTorr, a formed silicon nitride film attains a critical voltage of 0.7 V. The partial pressure of ammonia gas supplied in forming the silicon nitride film having this critical voltage is 200−66=134. The partial pressure of TCS gas is almost half that of ammonia gas. In forming a silicon nitride film by thermal CVD using TCS as a source, if the partial pressure of TCS gas supplied in forming a silicon nitride film is set half or more that of ammonia gas, a silicon nitride film 5 nm thick can attain a critical voltage of 0.7 V or more.

When, however, a silicon nitride film is formed by thermal CVD using DCS as a source, like the prior art, the critical voltage of the formed silicon nitride film does not increase even at a high partial pressure of DCS supplied in forming the silicon nitride film.

To the contrary, the present invention forms a silicon nitride film by thermal CVD using TCS not containing any hydrogen as a silicon source. Further, the ratio of the partial pressure of TCS supplied in forming a silicon nitride film to that of simultaneously supplied ammonia gas is controlled to 0.5 or more. By using TCS and controlling the partial pressure of TCS, the field strength of the formed silicon nitride film is controlled without changing the film formation thickness, and a desired field strength (critical voltage) is obtained with a desired film thickness.

In the above description, the silicon nitride film is used for the capacitor of a DRAM. However, the present invention is not limited to this, and a silicon nitride film formed using TCS as a source may be used for the gate insulating film of a MOS transistor. If the silicon nitride film having a high permittivity is used for the gate insulating film of the MOS transistor, the gate insulating film can be made thicker than in the use of an SiO$_2$ film. This can increase the gate critical voltage.

Figure 3A:
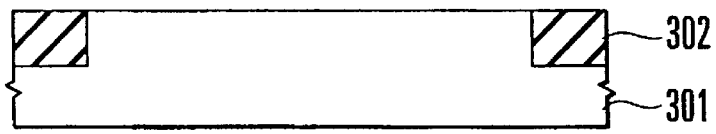
FIGS. 3A to 3F are sectional views for explaining the steps in manufacturing a MOS transistor.
Figure 3B:
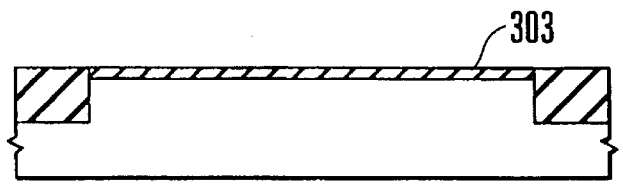

A MOS transistor manufacturing method will be described. As shown in FIG. 3A, an element isolation region 302 is formed to surround a predetermined region of a silicon substrate 301. As shown in FIG. 3B, the exposed surface of the substrate 301 is thermally oxidized to form an oxide film 303 to a film thickness of 0.5 to 1.5 nm.

Figure 3C:
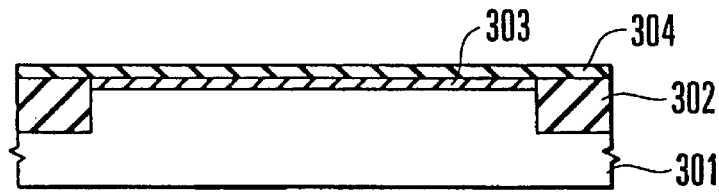

As shown in FIG. 3C, the resultant structure is heated in an ammonia atmosphere, and a silicon nitride film is deposited on the oxide film 303 by thermal CVD using TCS as a source to form a silicon nitride film 304 having a film thickness of 1.0 to 3 nm. Deposition of the silicon nitride film is performed by setting the temperature of the substrate 301 to 600 to 700° C. while setting the total pressure in the heating vessel where the substrate 301 is placed to 0.2 Torr, and setting the ratio of the partial pressure of TCS gas in the heating vessel to that of ammonia gas to 0.5 or more. By thermal CVD using TCS as a source while setting the ratio of the partial pressure of TCS gas to that of ammonia gas to 0.5 or more, a silicon nitride film can be formed with a desired critical voltage without generating any particle.

Figure 3D:
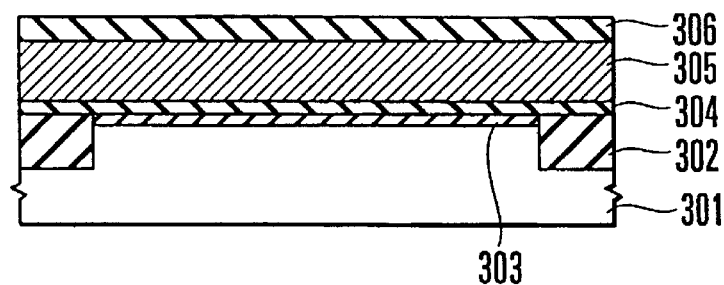

After the silicon nitride film 304 is formed, silicon is deposited by CVD to form a polysilicon film 305 to a film thickness of about 20 to 200 nm, as shown in FIG. 3D. Then, a silicon nitride film 306 is formed by CVD on the polysilicon film 305 to a film thickness of about 20 to 100 nm. The silicon nitride film 306 is formed similarly to the silicon nitride film 304.

Figure 3E:
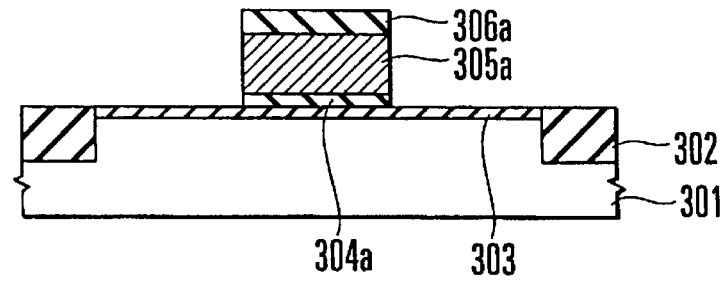

As shown in FIG. 3E, the silicon nitride film 304, polysilicon film 305, and silicon nitride film 306 are processed by known photolithography and etching, thereby forming a gate electrode 305a, a gate insulating film 304a below the gate electrode 305a, and a capping layer 306a on the gate electrode 305a.

Figure 3F:
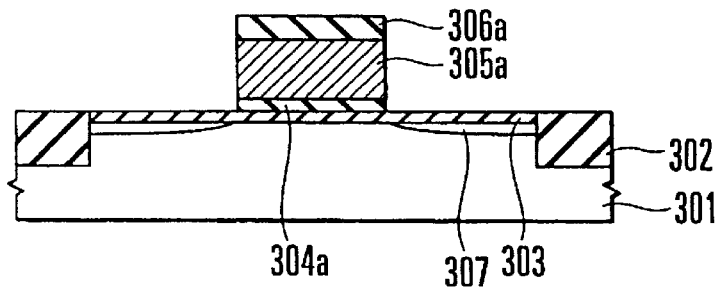

After the gate electrode 305a is formed, ions are implanted using as a mask the gate electrode 305a, gate insulating film 304a below the gate electrode 305a, and capping layer 306a on the gate electrode 305a, thereby forming lightly doped regions 307 where an impurity is lightly doped in the substrate 301, as shown in FIG. 3F.

Figure 3G:
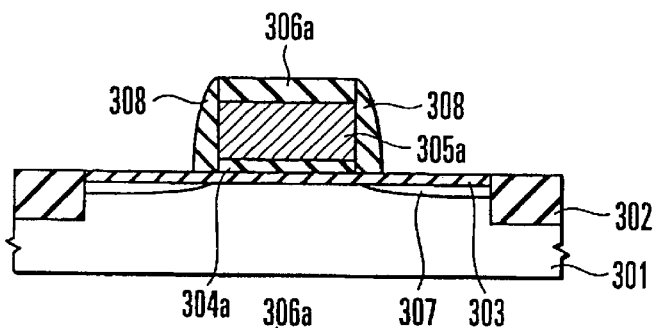
FIGS. 3G to 3K are section views for explaining the steps subsequent to FIGS. 3A to 3F in manufacturing a MOS transistor.

After the lightly doped regions 307 are formed, side walls 308 made of a silicon nitride film are formed on the side surfaces of the gate electrode 305a, gate insulating film 304a below the gate electrode 305a, and capping layer 306a on the gate electrode 305a, as shown in FIG. 3G.

Figure 3H:
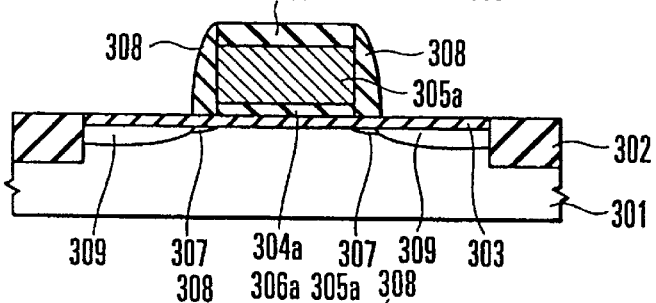

As shown in FIG. 3H, ions are implanted using as a mask the gate electrode 305a, gate insulating film 304a below the gate electrode 305a, capping layer 306a on the gate electrode 305a, and side walls 308, thereby forming source and drain regions 309 where an impurity is doped in the substrate 301.

Figure 3I:
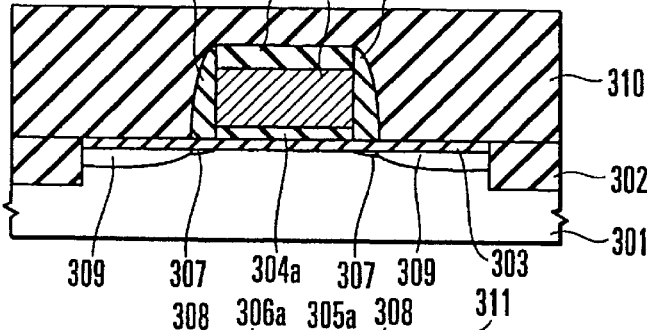

After the source and drain regions 309 are formed, an SiO$_2$ film is deposited on the substrate 301 so as to cover the gate electrode 305a, gate insulating film 304a below the gate electrode 305a, and capping layer 306a on the gate electrode 305a, thereby forming an interlevel insulating film 310 having a film thickness of about 30 to 1,000 nm, as shown in FIG. 3I.

Figure 3J:
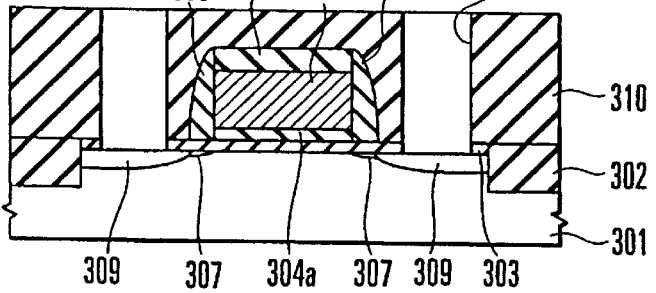
Figure 3K:
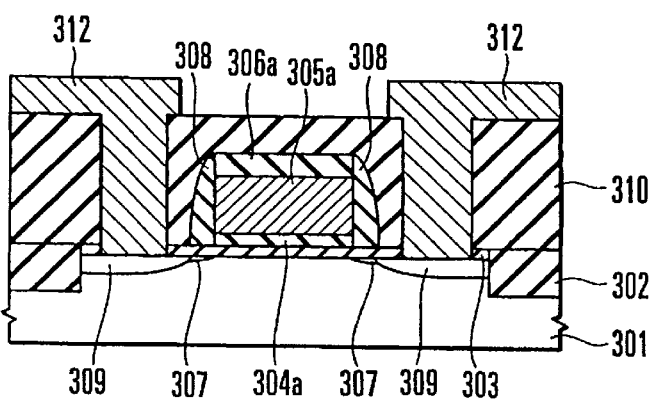

As shown in FIG. 3J, contact holes 311 are formed at predetermined portions in the interlevel insulating film 310, and filled with metal films. As shown in FIG. 3K, the metal films are processed by known photolithography and etching to form source and drain electrodes 312 which are connected to the source and drain regions 309 via contact plugs 312. Accordingly, a MOS transistor is formed on the substrate 301.

The gate insulating film of the MOS transistor shown in FIG. 3K uses a silicon nitride film higher in permittivity than an SiO$_2$ film. The gate insulating film can be formed thick, and the gate critical voltage can be increased. Note that when the silicon nitride film is used for the gate insulating film, a thin oxide film is desirably formed on the surface of the silicon substrate in order to suppress formation of interface states at the interface with the silicon substrate. If no interface states are formed on the surface of the silicon substrate, the silicon nitride film may be directly formed as a gate insulating film.

In this MOS transistor, the silicon nitride film is formed by thermal CVD which uses TCS as a source, and sets the ratio of the partial pressure of TCS gas to that of ammonia gas to 0.5 or more. This can increase the critical voltage of the gate insulating film in comparison with the use of a silicon oxide film.

As has been described above, according to the present invention, while a substrate to be subjected to film formation is heated to a predetermined temperature, silicon tetrachloride and ammonia gases are supplied onto the substrate at the ratio of the partial pressure of silicon tetrachloride gas to that of ammonia gas as 0.5 or more.

According to the present invention, a silicon nitride film is formed by supplying silicon tetrachloride and ammonia gases while setting the ratio of the partial pressure of silicon tetrachloride gas to that of ammonia gas to 0.5 or more. The silicon source gas contains no hydrogen. As a result, almost no hydrogen is contained in the formed silicon nitride film, and the leakage current of the formed silicon nitride film can be suppressed. Therefore, according to the present invention, even a silicon nitride film as thin as about 5 nm can attain a critical voltage of 0.7 V or more.

What is claimed is:

1. A silicon nitride film formation method comprising the steps of:

heating a substrate to be subjected to film formation; and supplying silicon tetrachloride and ammonia gases to the substrate heated to a predetermined temperature and forming a silicon nitride film having a thickness no greater than 3 nm, wherein a ratio of a partial pressure of the silicon tetrachloride gas to a partial pressure of the ammonia gas is set to not less than 0.5.

2. The method according to claim 1, wherein the predetermined temperature is 600 to 700° C.

3. The method according to claim 1, wherein the thickness of the silicon nitride film is set to 1 to 3 nm.

4. The method according to claim 1, wherein the silicon nitride film is formed on the substrate to produce a capacitor of an integrated circuit.

5. The method according to claim 1, wherein the silicon nitride film is formed on a gate oxide film of an integrated circuit formed on the substrate.

* * * * *